US009513693B2

(12) United States Patent
Jain et al.

(10) Patent No.: US 9,513,693 B2
(45) Date of Patent: Dec. 6, 2016

(54) L2 CACHE RETENTION MODE

(71) Applicant: Apple Inc., Cupertino, CA (US)

(72) Inventors: Prashant Jain, San Jose, CA (US); Brian P. Lilly, San Francisco, CA (US); Mahnaz Sadoughi-Yarandi, Santa Clara, CA (US); Helen Huang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 284 days.

(21) Appl. No.: 14/224,773

(22) Filed: Mar. 25, 2014

(65) Prior Publication Data

US 2015/0277541 A1     Oct. 1, 2015

(51) Int. Cl.
*G06F 1/32* (2006.01)
*G11C 7/12* (2006.01)
*G06F 12/08* (2016.01)

(52) U.S. Cl.
CPC ........... *G06F 1/3275* (2013.01); *G06F 1/3225* (2013.01); *G06F 1/3296* (2013.01); *G06F 12/0802* (2013.01); *G11C 7/12* (2013.01)

(58) Field of Classification Search
None
See application file for complete search history.

(56) References Cited

U.S. PATENT DOCUMENTS

| 8,171,326 | B2 | 5/2012 | Keller et al. |
| 8,806,232 | B2 | 8/2014 | Millet et al. |
| 8,914,580 | B2 | 12/2014 | Goel et al. |
| 8,984,227 | B2 | 3/2015 | Shiu et al. |
| 9,218,040 | B2 | 12/2015 | Biswas et al. |
| 9,261,939 | B2 | 2/2016 | Biswas et al. |
| 2011/0103169 | A1* | 5/2011 | Oh ........................ G11C 7/04 365/222 |
| 2014/0189411 | A1 | 7/2014 | Kanchana et al. |
| 2014/0298058 | A1 | 10/2014 | Klingauf et al. |
| 2014/0337605 | A1 | 11/2014 | Hall et al. |
| 2015/0067361 | A1* | 3/2015 | Rusu ..................... G06F 1/3275 713/320 |
| 2015/0309939 | A1 | 10/2015 | Sadoughi-Yarandi et al. |

OTHER PUBLICATIONS

Saund, et al., U.S. Appl. No. 14/870,272, entitled "Intelligent Cache Power Management", filed Sep. 30, 2015, 44 pages.

\* cited by examiner

*Primary Examiner* — Kim Huynh
*Assistant Examiner* — Joshua Neveln
(74) *Attorney, Agent, or Firm* — Rory D. Rankin; Meyertons, Hood, Kivlin, Kowert & Goetzel, P.C.

(57) ABSTRACT

Systems and methods for reducing leakage power in a L2 cache within a SoC. The L2 cache is partitioned into multiple banks, and each bank has its own separate power supply. An idle counter is maintained for each bank to count a number of cycles during which the bank has been inactive. The temperature and leaky factor of the SoC are used to select an operating point of the SoC. Based on the operating point, an idle counter threshold is set, with a high temperature and high leaky factor corresponding to a relatively low idle counter threshold, and with a low temperature and low leaky factor corresponding to a relatively high idle counter threshold. When a given idle counter exceeds the idle counter threshold, the voltage supplied to the corresponding bank is reduced to a voltage sufficient for retention of data but not for access.

20 Claims, 7 Drawing Sheets

L2 CACHE RETENTION MODE

BACKGROUND

1. Field of the Invention

The present invention relates generally to data caches, and in particular to methods and mechanisms for reducing leakage current in data caches during periods of low activity.

2. Description of the Related Art

Modern day mobile electronic devices often include multiple components or agents sharing access to one or more memory devices. These multiple agents may make large numbers of requests to memory, and as the number of these requests increases, the power consumption of the device increases, which limits the battery life of the device. One approach for reducing power consumption is to try to reduce the number of times that off-chip memory is accessed by caching data in or near the processor.

Conventional caches are typically coupled to or nearby a processor and store data that is frequently accessed by the processor to reduce latency. In a conventional cache, periods of inactivity may occur when the cache (or a portion of the cache) is not accessed for a certain amount of time. If the cache is not being accessed but is still supplied with a voltage sufficient for allowing accesses, leakage current will be lost without any corresponding benefit to the processor. Additionally, as the temperature of the processor increases, the amount of leakage current also increases.

SUMMARY

Systems and methods for reducing leakage power in a system on chip (SoC) are disclosed. In order to reduce leakage power, one or more components of the SoC may be put into retention mode based on one or more detected conditions. In one embodiment, a first cache of the SoC may be put into retention mode if the first cache has been inactive for more than a threshold number of clock cycles. An idle counter may be maintained to count the number of cycles during which the first cache has not been accessed. The threshold may be set based on a temperature of the SoC and based on a leakiness of the SoC fabrication process. In one embodiment, the first cache may be a level-two (L2) cache.

In one embodiment, the L2 cache may include a plurality of banks and the power supplied to each bank may be controlled independently of the other banks. An idle counter may be maintained for each bank of the L2 cache, and the idle counter may count the number of cycles during which a corresponding bank of the L2 cache has been inactive. If the idle counter exceeds a threshold, then the voltage supplied to the corresponding bank may be reduced to a first voltage sufficient for retention but not for access.

In one embodiment, the idle counter threshold may be set based on the current temperature of the SoC and a leaky factor associated with the SoC. The SoC may include one or more temperature sensors, and the temperature may be monitored during operation of the SoC. In one embodiment, the temperature may be compared to a temperature threshold. As a result of the comparison, the temperature may be designated as being higher or lower than the temperature threshold and stored as a one-bit value. The leaky factor may be determined based on the leakiness of the process used to fabricate the SoC, and this leaky factor may be stored in a read-only memory (ROM). In one embodiment, the leaky factor may be specified as leaky or not leaky and stored as a one-bit value.

In one embodiment, the operating point of the SoC may be determined based on a one-bit temperature value and a one-bit leaky factor. Accordingly, the operating point may take on one of four possible values depending on the temperature value and leaky factor. The idle counter threshold may be set based on the operating point of the SoC. For example, if the SoC temperature is greater than the temperature threshold and the SoC is specified as leaky, then the idle counter threshold may be set to a relatively low value. Alternatively, if the SoC temperature is lower than the temperature threshold and the SoC is specified as not leaky, then the idle counter threshold may be set to a relatively high value.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which.

DETAILED DESCRIPTION OF EMBODIMENTS

Figure 1:
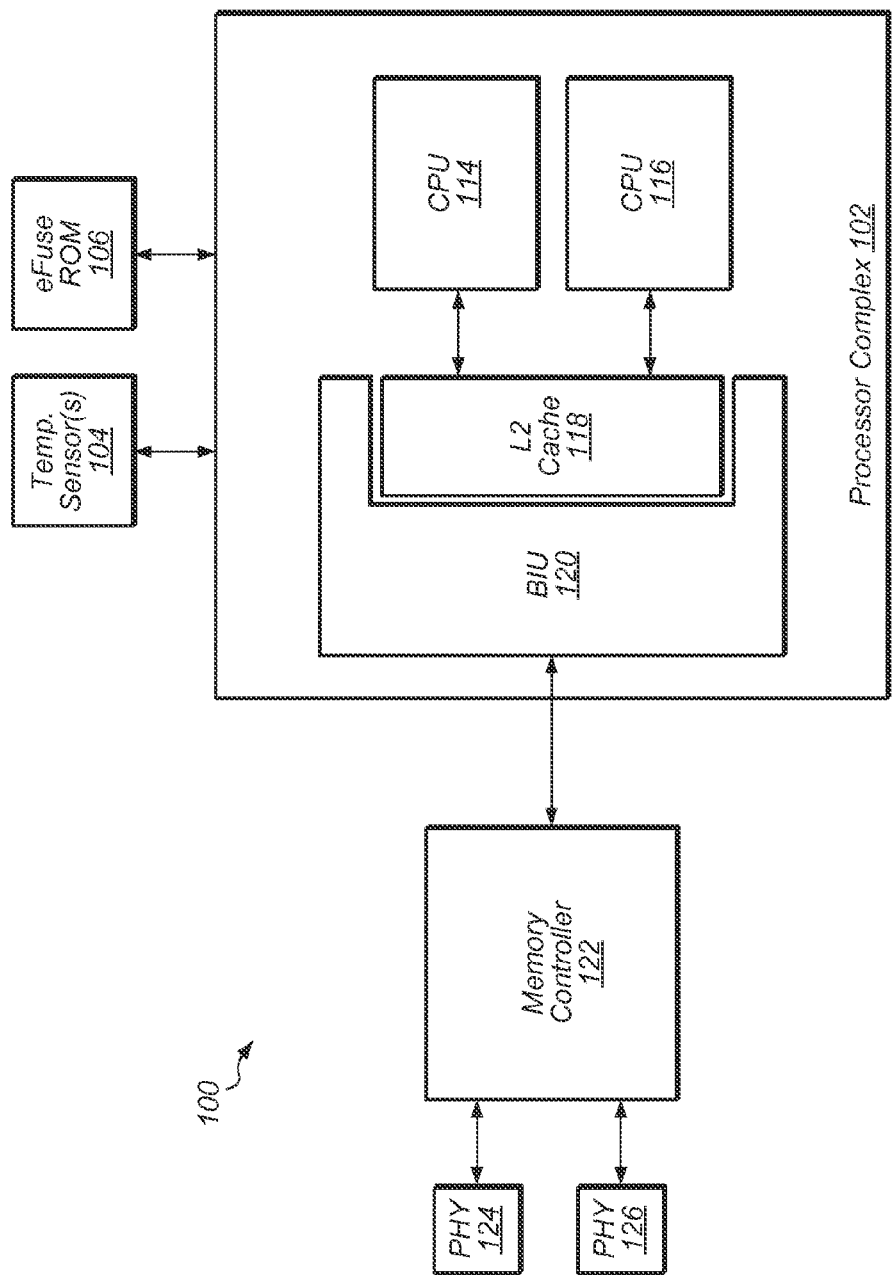
FIG. 1 illustrates one embodiment of a portion of an integrated circuit.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A processor comprising a cache . . . ." Such a claim does not foreclose the processor from including additional components (e.g., an execution unit, a fetch unit).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a cache with a plurality of cache lines, the terms "first" and "second" cache lines can be used to refer to any two of the plurality of cache lines.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Referring now to FIG. 1, a block diagram illustrating one embodiment of a portion of an integrated circuit (IC) is shown. In the illustrated embodiment, IC 100 includes a processor complex 102, temperature sensor(s) 104, eFuse read-only memory (ROM) 106, memory controller 122, and memory physical interface circuits (PHYs) 124 and 126. It is noted that IC 100 may also include many other components not shown in FIG. 1. In various embodiments, IC 100 may also be referred to as a system on chip (SoC), an application specific integrated circuit (ASIC), or an apparatus.

Processor complex 102 may include central processing units (CPUs) 114 and 116, level two (L2) cache 118, and bus interface unit (BIU) 120. Processor complex 102 may also be referred to as processor unit 102. In other embodiments, processor complex 102 may include other numbers of CPUs. CPUs 114 and 116 may also be referred to as processors or cores. It is noted that processor complex 102 may include other components not shown in FIG. 1.

The CPUs 114 and 116 may include circuitry to execute instructions defined in an instruction set architecture. Specifically, one or more programs comprising the instructions may be executed by CPUs 114 and 116. Any instruction set architecture (ISA) may be implemented in various embodiments, including industry standard, custom-designed, or proprietary ISA's, or any combination thereof.

Each of CPUs 114 and 116 may also include a level one (L1) cache (not shown), and each L1 cache may be coupled to L2 cache 118. Other embodiments may include additional levels of cache (e.g., level three (L3) cache). In one embodiment, L2 cache 118 may be configured to cache instructions and data for low latency access by CPUs 114 and 116. The L2 cache 118 may comprise any capacity and configuration (e.g., direct mapped, set associative). L2 cache 118 may be coupled to memory controller 122 via BIU 120. BIU 120 may also include various other logic structures to couple CPUs 114 and 116 and L2 cache 118 to various other devices and units.

Processor complex 102 may include or be coupled to temperature sensor(s) 104. Temperature sensor 104 is representative of any number of temperature sensors which may be utilized in IC 100. For example, in one embodiment, there may be a temperature sensor 104 for each CPU 114 and 116. Processor complex 102 may also be coupled to electronic fuse (eFuse) read-only memory (ROM) 106. In one embodiment, eFuse ROM 106 may store any amount of data, including a leaky factor specifying a leakiness of IC 100. The leaky factor may be set based on the leakiness of the process used to fabricate IC 100. It is noted that in other embodiments, the leaky factor may be stored in other locations and/or in other types of devices.

Processor complex 102 may retrieve the leaky factor from eFuse ROM 106 and use this value along with the value(s) from temperature sensor(s) 104 to set an idle counter threshold. The idle counter threshold may be utilized when determining whether to place portions or the entirety of L2 cache 118 into retention mode. These techniques are described in further detail in the remainder of the specification.

Memory controller 122 may include any number of memory ports and may include circuitry configured to interface to memory. For example, memory controller 122 may be configured to interface to dynamic random access memory (DRAM) such as synchronous DRAM (SDRAM), double data rate (DDR) SDRAM, DDR2 SDRAM, Rambus DRAM (RDRAM), etc. Memory controller 122 may also be coupled to memory physical interface circuits (PHYs) 124 and 126. Memory PHYs 124 and 126 are representative of any number of memory PHYs which may be coupled to memory controller 122. Memory PHYs 124 and 126 may be configured to interface to memory devices (not shown).

It is noted that other embodiments may include other combinations of components, including subsets or supersets of the components shown in FIG. 1 and/or other components. While one instance of a given component may be shown in FIG. 1, other embodiments may include two or more instances of the given component. Similarly, throughout this detailed description, embodiments that include only one instance of a given component may be used even if multiple instances are shown.

Figure 2:
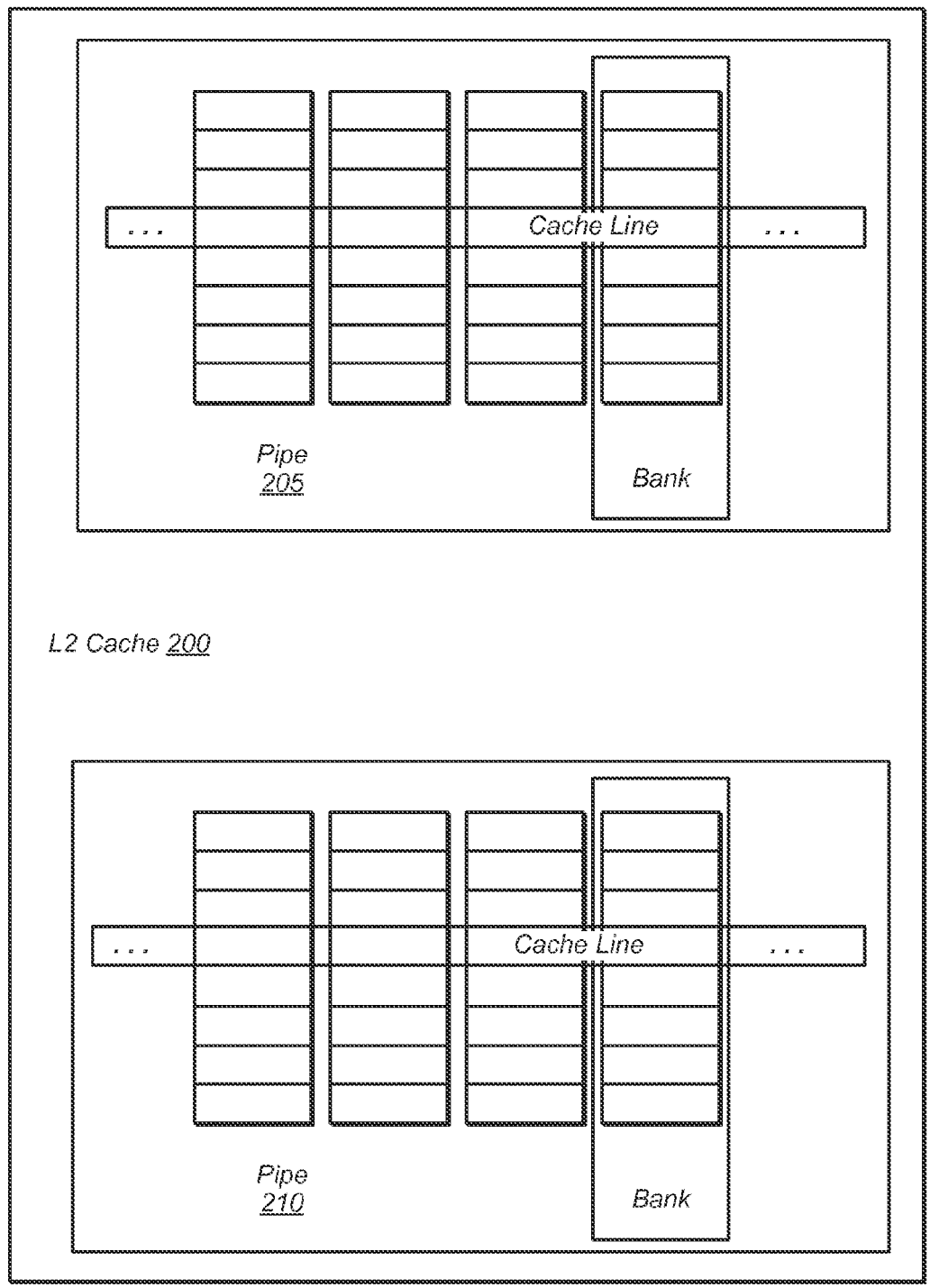
FIG. 2 illustrates one embodiment of a L2 cache.

Turning now to FIG. 2, one embodiment of a L2 cache 200 is shown. L2 cache 200 includes pipe 205 and pipe 210, which are two separate pipe blocks of L2 cache 200. Each of pipes 205 and 210 may include a plurality of banks and a plurality of cache lines. In one embodiment, L2 cache 200 may be coupled to two processor cores. In this embodiment, pipe 205 may be coupled to a first processor core and pipe 210 may be coupled to a second processor core. In other embodiments, L2 cache 200 may be coupled to other numbers or processor cores, and in these embodiments, L2 cache 200 may have a separate control pipe for each processor core. Alternatively, two or more processor cores may share a single pipe of L2 cache 200.

Although not shown in FIG. 2, each bank of pipes 205 and 210 may have a separately controllable power supply. Additionally, a separate idle counter may be maintained for each bank to keep track of how long the respective bank has been inactive. When a given idle counter exceeds a programmable idle counter threshold, the corresponding bank may be put into retention mode to reduce the leakage current of the bank. The idle counter threshold may be programmed based on the temperature and leakiness of the host processor or SoC.

In one embodiment, the operating point of the host SoC may fall within one of four quadrants at any given point in time. In this embodiment, the temperature of the SoC may be compared to a programmable temperature threshold. If the temperature is relatively high (i.e., greater than the temperature threshold), then the SoC may be specified as having a high temperature. If the temperature is relatively low (i.e., less than the temperature threshold), then the SoC may be specified as having a low temperature. Similarly, the SoC may be specified as being leaky or not leaky. Therefore, using a one-bit value to encode the temperature and a one-bit value to encode the leaky factor, there are four possible values (or quadrants) for the operating point of the host SoC. Depending on which quadrant the SoC is operating in and the relative leakiness of the quadrant, the idle counter threshold may be set accordingly, with a lower threshold for a high leakiness quadrant and a higher threshold for a low leakiness quadrant. In this way, when the SoC is susceptible to or is exhibiting high leakage current, the idle counter threshold will be reduced, and banks of the L2 cache 200 will enter retention mode relatively early.

Figure 3:
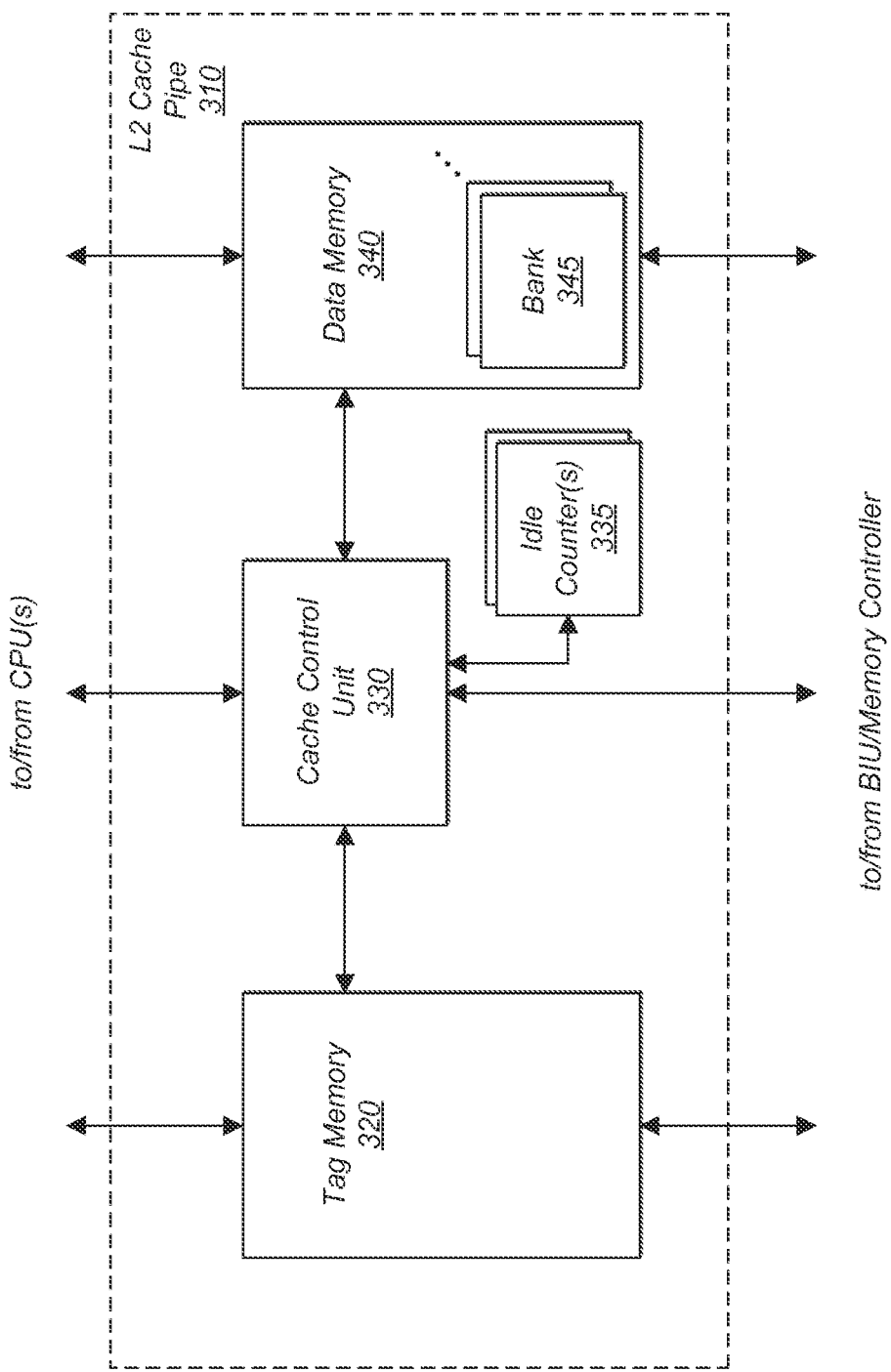
FIG. 3 is a block diagram illustrating one embodiment of a L2 cache pipe.

Referring now to FIG. 3, a block diagram of one embodiment of a L2 cache pipe 310 is shown. In one embodiment, L2 cache pipe 310 may include tag memory 320, data memory 340, cache control unit 330, and idle counter(s) 335. It is noted that L2 cache pipe 310 may also include other components and logic not shown in FIG. 3. For example, in other embodiments, L2 cache pipe 310 may include arbitration circuitry to arbitrate among requests. It is to be understood that the L2 cache architecture shown in FIG. 3 is merely one possible architecture that may be implemented. In other embodiments, other L2 cache architectures may be utilized in accordance with the methods and mechanisms disclosed herein. It is also noted that a L2 cache may have any number of pipes (e.g., 1, 2, 4, 8), depending on the embodiment.

In one embodiment, tag memory 320 may be coupled to receive addresses for requests from a processor or other requesting agent. Data memory 340 may be coupled to receive data or provide data for requests. Cache control unit 330 is coupled to tag memory 320 and data memory 340, and cache control unit 330 may be configured to receive various control data related to the received requests and to respond to the received control data. Data memory 340 may include a plurality of banks 345 and bank selection control may be provided from cache control unit 330. L2 cache pipe 310 may include an idle counter 335 for each bank 345 of data memory 340. Each idle counter 335 may count the number of cycles during which a corresponding bank 345 is inactive. When a given bank 345 is accessed, the corresponding idle counter 335 may be reset. When a given idle counter 335 exceeds a programmable threshold, then the corresponding bank 345 may be put into retention mode.

Data memory 340 may comprise a set of data entries, each having capacity to store a cache line of data. The cache line may be the unit of allocation and deallocation in data memory 340. The cache line may be any desirable size, such as 32 bytes or 64 bytes, although larger and smaller cache line sizes may be supported in other embodiments. In another embodiment, the cache lines of data memory 340 may be referred to as "cache blocks".

In various embodiments, data memory 340 may utilize any type of memory device. In one embodiment, data memory 340 may comprise a static random-access memory (SRAM), for example, indexed by entry number. Data memory 340 may be arranged so that a set of cache line storage locations may be selected for read/write operation responsive to an index portion of the input address (e.g., a number of bits of the address that may be decoded to uniquely select a set among the number of implemented sets). The cache line storage location that is to be accessed may be identified by the cache control unit 330 (e.g., responsive to detecting a cache hit for a request, responsive to allocating the cache line storage location to store a missing cache line). Data may be read from the accessed cache line storage location to return to the requestor for a read cache hit, or to transmit to the memory (or another cache) for a cache line evicted from L2 cache pipe 310. Data may be written to the accessed cache line storage location for a write cache hit from a requestor or to complete a cache fill of a missing cache line into an allocated cache line storage location.

Tag memory 320 may utilize any type of memory device, such as for instance, a SRAM. Alternatively, tag memory 320 may comprise a content addressable memory (CAM) for snooping purposes, or a RAM/CAM combination. The tag memory 320 may comprise a plurality of tag entries, each entry selected by a different value of the index mentioned above. The selected tag entry may store the tags that correspond to the set of cache line storage locations in L2 cache pipe 310 that are selected by the index. Each tag corresponds to a cache line in the respective cache line storage location, and may include the tag portion of the address of the corresponding cache line (i.e., the address, less the least significant bits that define an offset within the cache line and the bits that are used for the index), and various other state information. In response to a request, the tag memory 320 may be configured to decode the index and output the tags to the cache control unit 330 for processing. In an embodiment, the tag memory 320 may also include tag comparison circuitry configured to compare the tags to the tag portion of the request address, and may provide the comparison results to cache control unit 330. In another embodiment, cache control unit 330 may compare the tags. Cache control unit 330 may also be configured to perform various tag updates by writing the tag entry.

L2 cache pipe 310 may have any configuration. In some embodiments, a direct mapped or set associative configuration may be implemented. In typical direct mapped and set associative caches, there is a preconfigured, one-to-one correspondence between tag entries and data entries. In a direct mapped configuration, each address maps to one possible entry (tag memory 320 and data memory 340) in L2 cache pipe 310, at which the corresponding cache line would be stored. In one embodiment, L2 cache pipe 310 may be associative, in which a given address maps to two or more cache line storage locations in the data memory 340 that may be eligible to store the cache line. L2 cache pipe 310 may be set associative, in which each address maps to two or more possible entries (dependent on the associativity of the cache). In one embodiment, N cache line storage locations are mapped to addresses having the same value in a subset of the address bits referred to as an index, where N is an integer greater than one and less than the total number of cache line storage locations in data memory 340. The N cache line storage locations forming a set corresponding to a given index are often referred to as "ways". Other embodiments may be fully associative, in which any cache line storage location may be mapped to any address.

Figure 4:
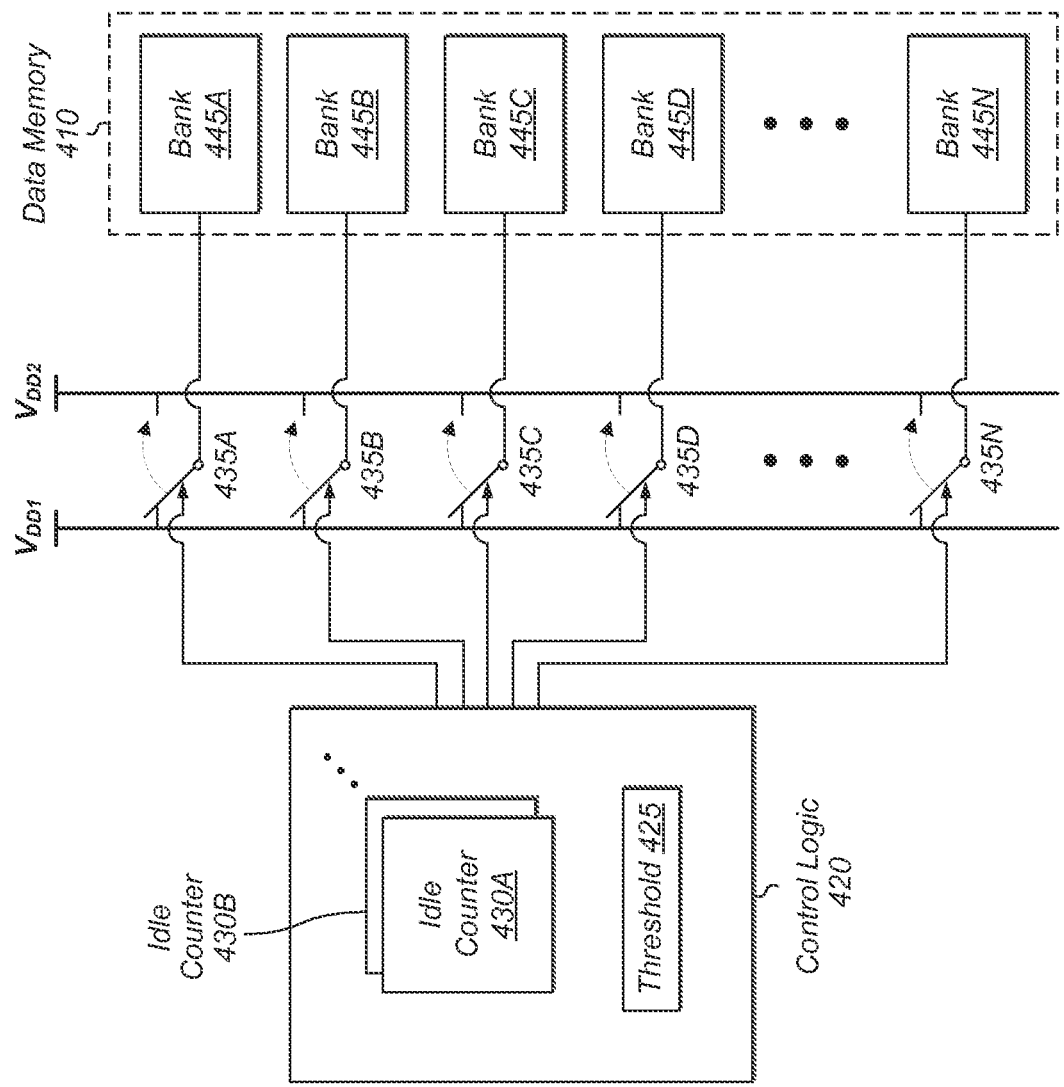
FIG. 4 is a block diagram illustrating one embodiment of a cache data memory partitioned into banks.

Turning now to FIG. 4, one embodiment of a cache data memory partitioned into banks is shown. Data memory 410 includes banks 445A-N, which are representative of any number of banks of data memory 410. It is noted the term "portion" may be used to refer more generally to a "bank" so as to indicate the cache may be broken up into sections, banks, partitions, or other portions smaller than the entire cache. In one embodiment, data memory 410 may be a static random-access memory (SRAM). In other embodiments, data memory 410 may be other types of memory.

In one embodiment, each bank 445A-N may be coupled to two independent power supplies ($V_{DD1}$) and ($V_{DD2}$) via independently controllable switches. Switches 435A-N are shown in FIG. 4, and each of these switches may be controlled by control logic 420. Control logic 420 may be located within the cache control unit, within the host processor, and/or elsewhere within the host SoC. Although switches 435A-N are shown in the figure as analog switches, this is for illustrative purposes only. In other embodiments, switches 435A-N may be digital switches. For example, in another embodiment, control logic 420 may send a control code to an individual power supply in order to program the output voltage which is supplied to a given bank 445 of data memory 410. Other types of switches and other techniques for controlling and adjusting the voltage supplied to each section of data memory 410 are possible and are contemplated. It is also noted that in other embodiments, each bank may be supplied with more than two independent supply voltages. Additionally, each switch may allow for the corresponding bank to be completely powered down.

The voltage provided to each bank may be determined by control logic 420 based on the value of a corresponding idle counter 430A-B. If a given idle counter 430 is less than the idle counter threshold, then the voltage supplied to the corresponding bank 445 may be the higher supply voltage ($V_{DD1}$) which allows the data in the bank to be read or written. If a given idle counter 430 is greater than the idle counter threshold, then the voltage supplied to the corresponding bank 445 may be the lower supply voltage ($V_{DD2}$) which allows the data in the bank to be retained but does not allow data to be read from or written to the bank. In one embodiment, for a specific type of cache architecture, ($V_{DD1}$) may be 1.8 volts while ($V_{DD2}$) may be 1.3 volts. In other embodiments, the actual voltages of the two supply voltages ($V_{DD1}$) and ($V_{DD2}$) may vary.

By controlling each bank 445A-N independently, the leakage power lost by the overall cache may be significantly reduced. When a given bank 445 is being accessed at relatively frequently, the supply voltage ($V_{DD1}$) may be higher and so the leakage power may be greater during this time. However, when a given bank 445 has an extended period of inactivity, the supply voltage may be reduced to a retention voltage ($V_{DD2}$) to reduce the leakage power lost. After a period of time of inactivity, the given bank 445 may need to be accessed again, and in preparation for this, control logic 420 may switch the supply voltage to the higher voltage ($V_{DD1}$). Control logic 420 may allow for a grace period to elapse so that the given bank 445 has a chance to ramp-up to the higher supply voltage ($V_{DD1}$). In an embodiment where the banks are relatively small, the ramp-up time should be short since the capacitive load of a bank will be relatively small. Generally speaking, the smaller the size of the bank, the less the capacitive load which translates to a shorter ramp-up time.

Figure 5:
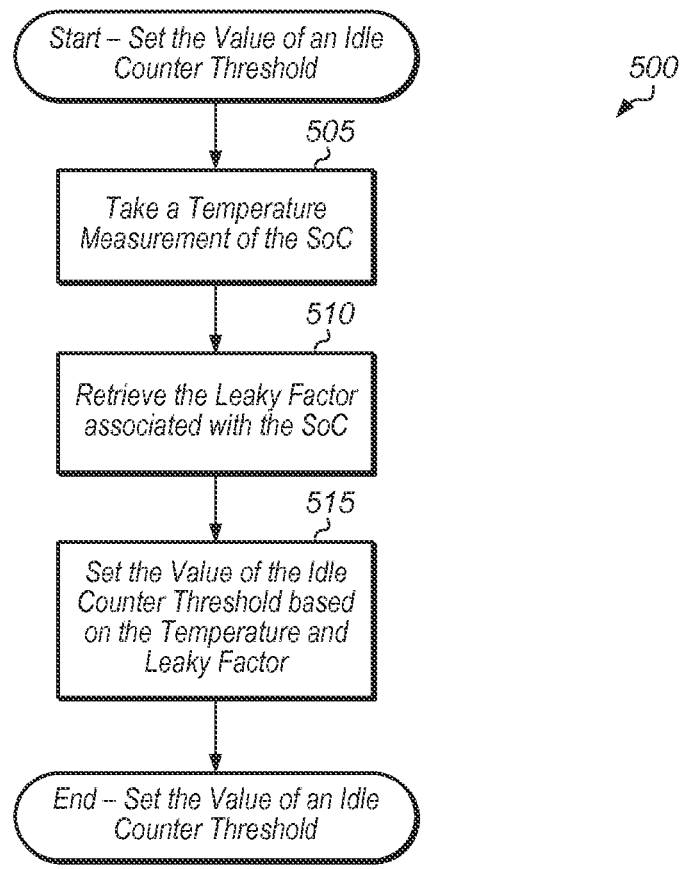
FIG. 5 is a generalized flow diagram illustrating one embodiment of a method for setting the value of an idle counter threshold.

Referring now to FIG. 5, one embodiment of a method 500 for setting the value of an idle counter threshold is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A temperature measurement may be taken from a temperature sensor at a location near the first cache of a SoC (block 505). In various embodiments, the SoC may have one or more temperature sensors, including a temperature sensor for the processor complex of the SoC. In this embodiment, the temperature sensor closest to the first cache may be used in block 505. In one embodiment, the first cache may be a L2 cache. In other embodiments, the first cache may be other types of caches (e.g., L1 cache, memory cache).

Also, the value of a leaky factor associated with the SoC may be retrieved (block 510). In one embodiment, the leaky factor may be based on the leakiness of the fabrication process used to fabricate the SoC. The leaky factor may be stored in any of various locations, depending on the embodiment. For example, in one embodiment, the leaky factor may be stored in a fuse read-only memory (ROM).

Next, an idle counter threshold may be set based on the temperature and leaky factor (block 515). After block 515, method 500 may end. In one embodiment, the idle counter threshold may be set to one of four values based on the operating point quadrant of the SoC. For example, the temperature may be compared to a temperature threshold and determined to be above or below the temperature threshold. Similarly, the leaky factor may be determined to be leaky or not leaky. The idle counter threshold may be set corresponding to the current operating point quadrant of the SoC.

In another embodiment, the idle counter threshold may be set based on a formula which includes the temperature and the leaky factor. For example, the idle counter threshold may be set to a value=1±(A*temperature+B*leaky_factor), where 'A' is a first weighting factor and 'B' is a second weighting factor. Other formulas for calculating the idle counter threshold may be utilized in other embodiments.

Figure 6:
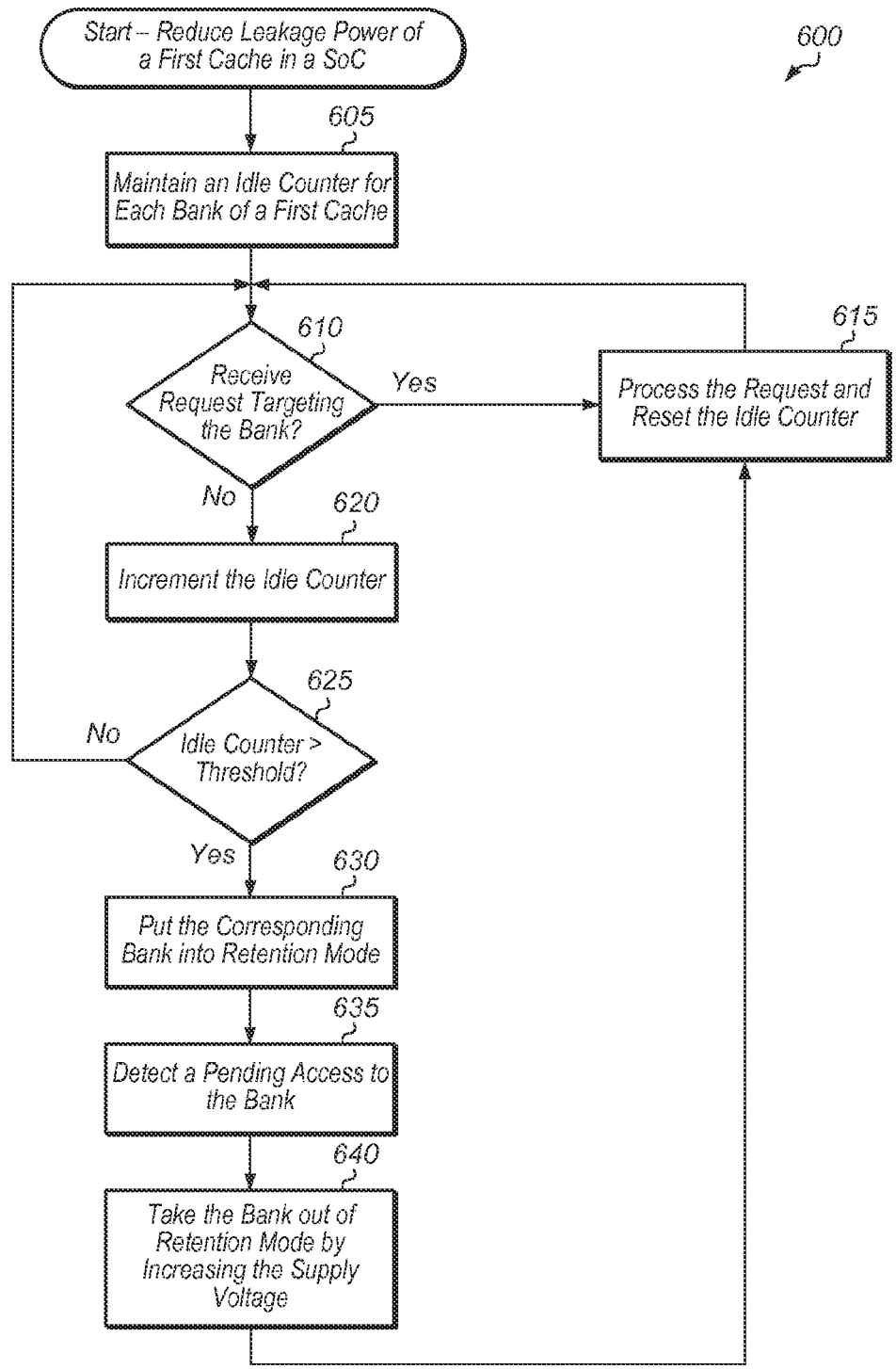
FIG. 6 is a generalized flow diagram illustrating one embodiment of a method for reducing leakage power of a first cache within a SoC.

Turning now to FIG. 6, one embodiment of a method 600 for reducing leakage power of a first cache within a SoC is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. It is noted that a separate instance of method 600 may be performed for each bank of the plurality of banks of a first cache of a SoC.

An idle counter may be maintained for each portion of a plurality of portions of a first cache within a SoC (block 605). In one embodiment, the first cache may be a L2 cache, and each portion may be a bank of the L2 cache. For example, if there are 16 banks of the L2 cache, then there may be 16 idle counters, one for each bank of the L2 cache. In other embodiments, the L2 cache may have other numbers of banks. It is also noted that in some embodiments, the L2 cache may be managed as a whole rather than in portions, and in these embodiments, there may be a single idle counter for the entire L2 cache. Additionally, it is noted that in other embodiments, the first cache may be any of various other types of caches, memories, or other devices within the SoC. In one embodiment, each idle counter may count the number of cycles for which the corresponding portion of the first device has been inactive. For example, for a bank of the L2 cache, the corresponding idle counter may count the number of cycles since the bank was last accessed to service a received request.

Next, it may be determined if a request has been received which targets the bank (conditional block 610). If a request has been received which targets the bank (conditional block 610, "yes" leg), then the request may be processed and the idle counter may be reset (block 615). After block 615, method 600 may return to conditional block 610. If no requests have been received which target the bank (conditional block 610, "no" leg), then the idle counter may be incremented (block 620). In one embodiment, for each clock cycle during which the bank is not accessed, the idle counter may be incremented.

After block 620, the current value of the bank idle counter may be compared to an idle counter threshold (conditional block 625). In one embodiment, the bank idle counter may be compared to the idle counter threshold once every 'N' clock cycles, wherein N is a programmable number. In one embodiment, the idle counter threshold may be set by method 500 (of FIG. 5). In this embodiment, method 500 may be performed concurrently with multiple instances (one instance for each bank of the cache) of method 600. Accordingly, the idle counter threshold may vary over time as the temperature of the SoC varies.

If the value of the bank idle counter is greater than the idle counter threshold (conditional block 625, "yes" leg), then the corresponding bank of the first cache may be put into retention mode (block 630). If the value of the bank idle counter is less than the idle counter threshold (conditional block 625, "no" leg), then method 600 may return to block 610 and determine if a request has been received which targets the bank.

At some point in time after the bank is put into retention mode by the lowering the supply voltage to the bank, a pending request to the bank may be detected (block 635). In response to detecting the pending request, the bank may be taken out of retention mode by increasing the supply voltage to allow for the pending access to be processed (block 640). Then, once the voltage to the bank has reached the higher supply voltage, method 600 may jump to block 615 to process the request and reset the idle counter.

It is noted that if more than one bank is coming out of retention mode at or near the same time, the SoC may spread these events out over time so as to avoid creating a voltage or current spike on the power supply. For example, if the entire first cache was ready to be taken out of retention mode, the SoC control logic may space out the accesses to the first cache such that the accesses are separated by a programmable interval.

Figure 7:
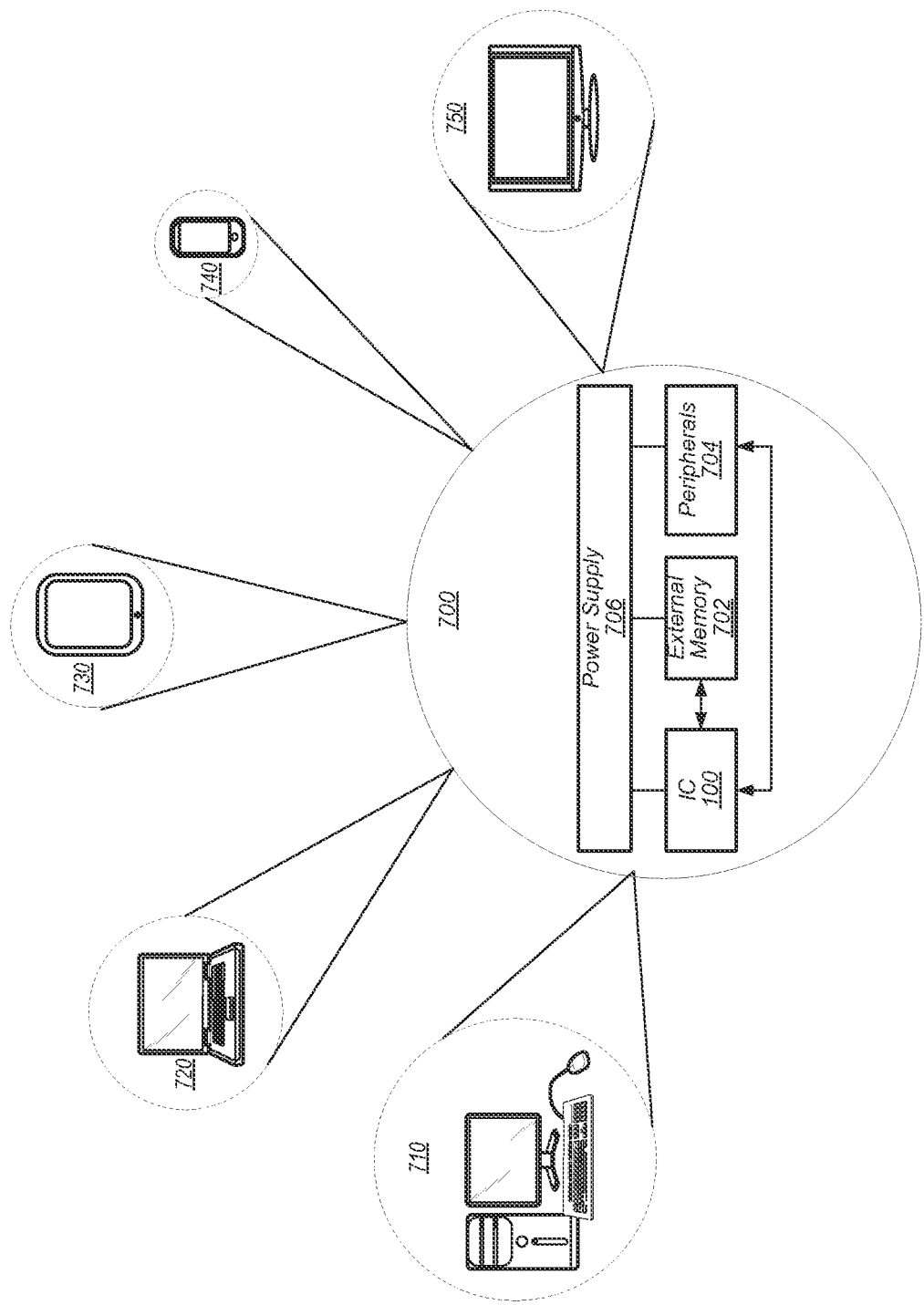
FIG. 7 is a block diagram of one embodiment of a system.

Referring next to FIG. 7, a block diagram of one embodiment of a system 700 is shown. As shown, system 700 may represent chip, circuitry, components, etc., of a desktop computer 710, laptop computer 720, tablet computer 730, cell phone 740, television 750 (or set top box configured to be coupled to a television), or otherwise. Other devices are possible and are contemplated. In the illustrated embodiment, the system 700 includes at least one instance of IC 100 (of FIG. 1) coupled to an external memory 702.

IC 100 is coupled to one or more peripherals 704 and the external memory 702. A power supply 706 is also provided which supplies the supply voltages to IC 100 as well as one or more supply voltages to the memory 702 and/or the peripherals 704. In various embodiments, power supply 706 may represent a battery (e.g., a rechargeable battery in a smart phone, laptop or tablet computer). In some embodiments, more than one instance of IC 100 may be included (and more than one external memory 702 may be included as well).

The memory 702 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 704 may include any desired circuitry, depending on the type of system 700. For example, in one embodiment, peripherals 704 may include devices for various types of wireless communication, such as wifi, Bluetooth, cellular, global positioning system, etc. The peripherals 704 may also include additional storage, including RAM storage, solid state storage, or disk storage. The peripherals 704 may include user interface devices such as a display screen, including touch display screens or multi-touch display screens, keyboard or other input devices, microphones, speakers, etc.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A processor comprising:
   a cache including a plurality of partitions;
   an idle counter for each partition of the plurality of partitions, wherein each idle counter is configured to count a number of consecutive cycles during which a corresponding partition has been inactive; and
   a temperature sensor configured to measure a temperature of the processor;
   wherein for each partition of the plurality of partitions the processor is configured to:
      set a programmable idle counter threshold for the partition based at least in part on a current temperature measured by the temperature sensor;
      compare a number of cycles indicated by an idle counter for the partition to the idle counter threshold for the partition; and
      selectively place the partition of the cache into a low power state responsive to detecting that the idle counter for the partition exceeds the idle counter threshold for the partition.

2. The processor as recited in claim 1, wherein the low power state is sufficient for the given partition to retain data but insufficient for a request to access the data of the given partition.

3. The processor as recited in claim 2, wherein the processor is further configured to:
compare the temperature measured by the temperature sensor to a programmable temperature threshold;
store an indication when the temperature exceeds the programmable temperature threshold; and
store an indication when the temperature does not exceed the programmable temperature threshold.

4. The processor as recited in claim 3, wherein:
the programmable idle counter threshold is set to a first value when the measured temperature exceeds the programmable temperature threshold;
the programmable idle counter threshold is set to a second value when the measured temperature does not exceed the programmable temperature threshold; and
the first value is lower than the second value.

5. The processor as recited in claim 3, wherein the programmable idle counter threshold is set based at least in part on a leaky factor associated with the processor.

6. The processor as recited in claim 5, wherein:
the programmable idle counter threshold is set to a first value responsive to determining the leaky factor indicates the processor is leaky;
the programmable idle counter threshold is set to a second value responsive to determining the leaky factor indicates the processor is not leaky; and
the first value is lower than the second value.

7. The processor as recited in claim 5, wherein:
the programmable idle counter threshold is set to a first value responsive to determining the leaky factor indicates the processor is leaky and the temperature exceeds the programmable temperature threshold;
the programmable idle counter threshold is set to a second value responsive to determining the leaky factor indicates the processor is not leaky and the temperature exceeds the programmable temperature threshold; and
the first value is lower than the second value.

8. A method comprising:
monitoring a temperature of a system on chip (SoC) with a temperature sensor, wherein the SoC comprises a cache, and wherein the cache comprises one or more banks;
providing a separate power supply to each bank of the one or more banks of the cache;
for each bank of the cache:
setting a corresponding programmable idle counter threshold based at least in part on a current temperature measured by the temperature sensor;
maintaining an idle counter to count a number of consecutive cycles during which the bank has been inactive; and
comparing a number of cycles indicated by the corresponding idle counter to the corresponding programmable idle counter threshold; and
causing the bank to go into retention mode responsive to determining that the corresponding idle counter exceeds the corresponding programmable idle counter threshold.

9. The method as recited in claim 8, wherein causing the bank to go into retention mode comprises reducing a voltage supplied to the bank.

10. The method as recited in claim 8, wherein a value of the corresponding programmable idle counter threshold is based at least in part on a leaky factor associated with the SoC.

11. The method as recited in claim 10, further comprising:
setting the corresponding programmable idle counter threshold to a first value responsive to determining the temperature of the SoC is greater than a programmable temperature threshold and if the SoC is determined to be leaky; and
setting the corresponding programmable idle counter threshold to a second value responsive to determining the temperature of the SoC is less than the programmable temperature threshold and the SoC is determined to be leaky, wherein the second value is greater than the first value.

12. The method as recited in claim 10, further comprising:
setting the corresponding programmable idle counter threshold to a first value responsive to determining the temperature of the SoC is greater than a programmable temperature threshold and the SoC is determined to be leaky; and
setting the corresponding programmable idle counter threshold to a second value responsive to determining the temperature of the SoC is greater than the programmable temperature threshold and the SoC is determined to be not leaky, wherein the second value is greater than the first value.

13. The method as recited in claim 8, wherein the cache is a (L2) level-two cache.

14. The method as recited in claim 13, wherein the SoC comprises a processor complex, wherein the processor complex comprises two or more processors, and wherein the two or more processors are configured to share the L2 cache.

15. A system comprising:
a memory; and
a processor, wherein the processor comprises a temperature sensor configured to measure a temperature of the processor, a cache, and wherein the cache comprises a cache memory and a cache control unit;
wherein the cache memory comprises one or more banks, wherein each bank of the one or more banks has a separately controllable power supply; and
wherein the cache control unit is configured to:
set a corresponding programmable idle counter threshold for a given bank based at least in part on a current temperature measured by the temperature sensor;
compare a number stored in a corresponding idle counter for the given bank to the corresponding programmable idle counter threshold, wherein the number corresponds to a count of consecutive cycles during which the given bank has been inactive; and
place the given bank into retention mode responsive to determining that the corresponding idle counter has exceeded the corresponding programmable idle counter threshold.

16. The system as recited in claim 15, wherein the corresponding programmable idle counter threshold is set based on at least in part on a leaky factor associated with the processor.

17. The system as recited in claim 16, wherein the processor is configured to decrease the corresponding programmable idle counter threshold responsive to determining the temperature of the processor increases above a programmable temperature threshold.

18. The system as recited in claim 17, wherein the processor is configured to increase the corresponding programmable idle counter threshold responsive to determining the temperature of the processor decreases below the programmable temperature threshold.

19. The system as recited in claim 15, wherein placing a given bank into retention mode comprises lowering a supply voltage provided to the given bank.

20. The system as recited in claim 15, wherein a leaky factor associated with the processor is determined by reading a value from a read-only memory (ROM).

* * * * *

UNITED STATES PATENT AND TRADEMARK OFFICE
CERTIFICATE OF CORRECTION

PATENT NO.         : 9,513,693 B2                                           Page 1 of 1
APPLICATION NO.    : 14/224773
DATED              : December 6, 2016
INVENTOR(S)        : Jain et al.

It is certified that error appears in the above-identified patent and that said Letters Patent is hereby corrected as shown below:

In the Claims

Column 12, Claim 11, Line 9, please delete "and if the" and substitute -- and the --.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*